Figure 1:
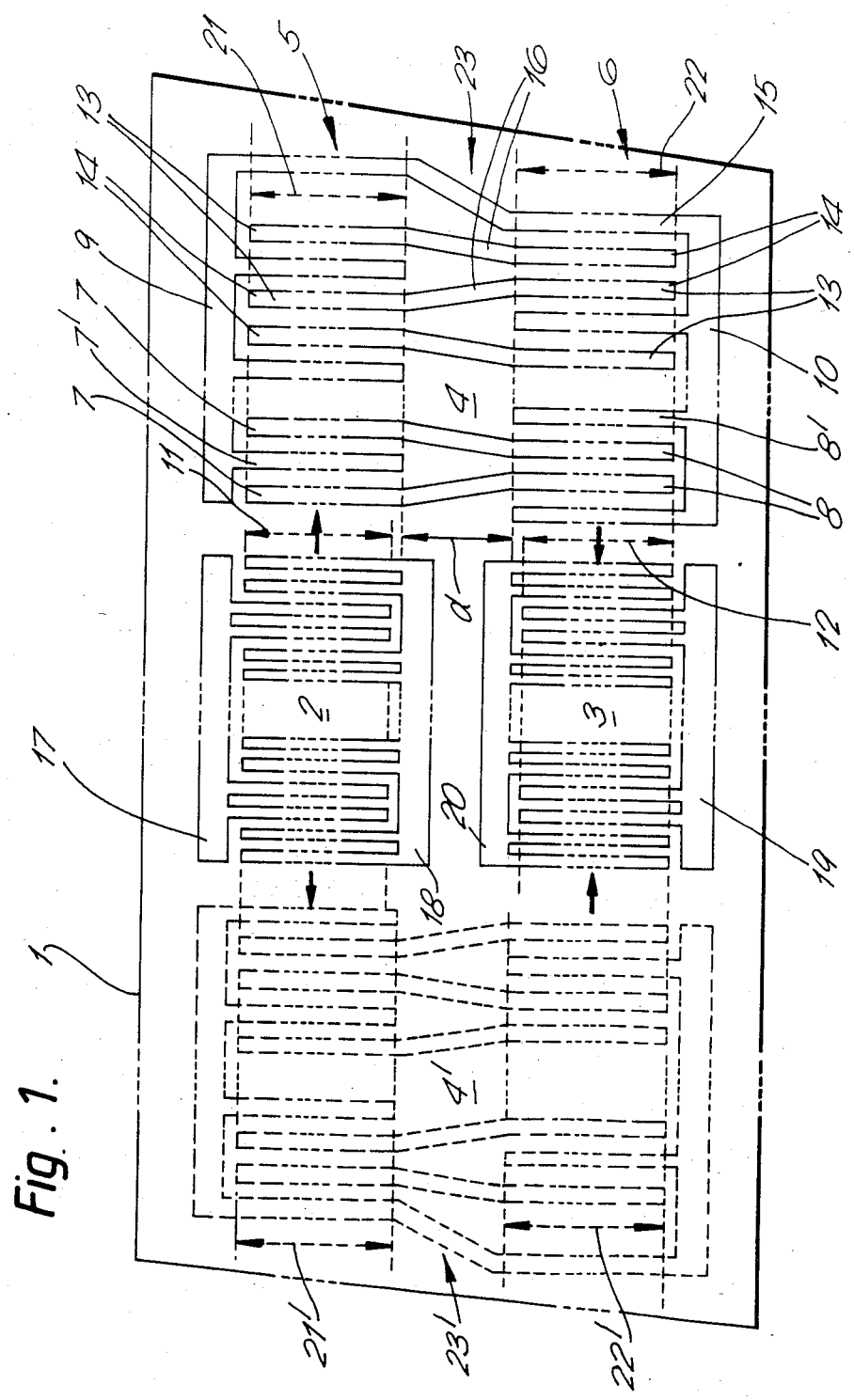

United States Patent [19]

Schofield

[11] Patent Number: 4,591,815
[45] Date of Patent: May 27, 1986

[54] SURFACE-PROPAGATING ACOUSTIC WAVE DEVICE

[75] Inventor: John Schofield, Coulsdon, England

[73] Assignee: U.S. Philips Corporation, New York, N.Y.

[21] Appl. No.: 756,404

[22] Filed: Jul. 18, 1985

[30] Foreign Application Priority Data

Jul. 25, 1984 [GB] United Kingdom ................ 8418978

[51] Int. Cl.⁴ ....................... H03H 9/64; H03H 9/145
[52] U.S. Cl. .................................... 333/195; 333/153; 333/196; 310/313 D
[58] Field of Search ................................ 333/150-155, 333/193-196; 310/313 A, 313 B, 313 C, 313 D

[56] References Cited

U.S. PATENT DOCUMENTS 4,166,987 9/1979 Coldren .......................... 333/193 X
4,510,471 4/1985 Flinn et al. ....................... 333/196 X
4,511,867 4/1985 Schofield ............................ 333/195

FOREIGN PATENT DOCUMENTS 1492766 11/1977 United Kingdom .

Primary Examiner—Marvin L. Nussbaum
Attorney, Agent, or Firm—Robert T. Mayer; Bernard Franzblau

[57] ABSTRACT

An improvement to the reflective multistrip coupler of the surface acoustic wave device described in EPA No. 0098661 for overcoming the k-determined bandwidth limitation wherein, instead of being uniform, the electrode spacing is varied correspondingly along the input and output arrays of the coupler with the result that different frequency bands will be reflected by different groups of electrodes. At least two reflective couplers (24, 25) with complementary spacing variations are included in the path coupling the input and output transducers (2, 3) so that all frequencies in the overall passband have substantially the same overall time delay. Contiguous bands of frequencies $f_1$, $f_2$, $f_3$, $f_4$ may be reflected by individual related groups 26, 27, 28, 29 of uniformly spaced electrodes forming either a monotonic or a permutated sequence, or the spacing can be varied continuously and monotonically.

9 Claims, 7 Drawing Figures

SURFACE-PROPAGATING ACOUSTIC WAVE DEVICE

This invention relates to a surface-propagating acoustic wave bandpass electrical filter device including a piezoelectric substrate able to propagate acoustic waves at a surface thereof, input transducing means arranged to launch acoustic wave energy along a first propagation track at said surface, output transducing means arranged to receive acoustic wave energy from a second propagation track at said surface which does not overlap said first track, and electrical reflective multistrip coupling means arranged to receive acoustic wave energy correspondingly from the input transducing means and to relaunch at least part of that energy as acoustic wave energy back towards the output transducing means, in which said input and output transducers are formed by respective interdigital electrode arrays, and in which the reflective multistrip coupling means includes a reflective coupler comprising a first and a second array of mutually parallel conducting strips arranged respectively across corresponding input and output propagation tracks, each array comprising a first set of mutually insulated alternately widely and closely spaced strips, and a second set of electrically interconnected strips arranged so that at least one strip from the second set is situated between substantially every widely spaced pair of strips forming the first set, each strip forming a widely spaced pair in the first set of one array being respectively connected to a corresponding strip forming a closely spaced pair in the first set of the other array, and the second set of strips from both arrays are connected together. Such a device will be referred to herein as a surface-propagating acoustic wave device of the kind specified.

A surface-propagating acoustic wave device of the kind referred to has been described in European Patent Application Publication No. 0098661. The process of track-changing is commonly employed in surface-propagating acoustic wave filters in order to reduce the transfer of energy from the launching (input) to the receiving (output) transducer by means of various bulk acoustic wave modes which are themselves also launched and received by the type of interdigital transducer normally employed, and which have propagation velocities which differ, in some cases only slightly, from the propagation velocity of the desired surface acoustic wave.

Hitherto, the form of forward-transfer multistrip coupler disclosed for example in U.K. Patent Specification No. 1,372,235, has commonly been employed for track-changing, and, when suitably arranged, this form of coupler can transfer surface acoustic wave energy efficiently from one track to another, but the resultant device tends to occupy a relatively large area of substrate much of which is not employed for the useful propagation of acoustic wave energy. Furthermore, although a conventional interdigital transducer will launch surface-propagating acoustic wave energy equally in respective opposite directions from the two ends, a forward multistrip coupler can only conveniently couple one end of the launching transducer to one end of the receiving transducer, and acoustic energy launched from the other end of the launching transducer has to be absorbed or scattered and is therefore lost, thus increasing the insertion loss of the device. Such losses can be tolerated provided that the signal levels at which the device is to operate are high compared with circuit noise, as in the case of high level amplifiers. When, however, the device is to be employed in the early stages of, for example, a broadcast receiver, it is important to reduce the insertion loss as far as possible in order to provide a satisfactory signal-to-noise ratio.

The compact and potentially efficient form of reflective multistrip coupler described in the above mentioned European Patent Application Publication No. 0098661, provides a convenient means for reducing the area of substrate occupied by a track changing surface-propagating acoustic wave device and for coupling each end of a launching transducer to a corresponding end of an associated receiving transducer to form an arrangement which enables surface acoustic wave energy launched from both ends of a launching transducer to be transferred to a receiving transducer, thus significantly reducing the size (and hence the cost) and/or the insertion loss of the resultant device.

However, the bandwidth of the main passband of this form of reflective multistrip coupler is inversely dependent on the number of strip electrodes employed in the input and output arrays of the coupler, and that number is predetermined by the number of strip electrodes required, at the centre frequency $f_c$ of the passband, to transfer as much as possible of the input acoustic energy to the output track so as to propagate towards the output transducer. This number will be mainly determined by the coupling coefficient k of the piezoelectric substrate, and for lithium niobate the bandwidth provided would be about 1.7 percent of the centre frequency $f_c$.

It is an object of the invention to provide an improved form of surface-propagating acoustic wave device of the kind specified in which an increased bandwidth can be achieved.

According to the invention there is provided a surface-propagating acoustic wave device of the kind specified, characterised in that a corresponding end of the input and output transducers are coupled via a coupling path comprising a plurality of cascaded said reflective couplers, and that for each reflective coupler, the centre-to-centre spacing of the strips is modified in a corresponding manner along the first and the second array such that the input acoustic wave energy contained in successive frequency bands, which are at least contiguous, is correspondingly reflectively transferred to the output track by groups of said strips associated with different amounts of average signal delay, the respective distributions of signal delay with respect to frequency in the individual reflective couplers being so arranged in the coupling path that the overall propagation delay is substantially the same for all frequencies within the desired passband of the device.

In further accordance with the invention there is also provided a low-loss acoustic wave bandpass electrical filter device including a piezoelectric substrate able to propagate acoustic waves at a surface thereof, input transducing means arranged to launch acoustic wave energy along a propagation track at said surface, output transducing means arranged to receive acoustic wave energy from a second propagation track at said surface which is substantially parallel to but does not overlap said first track, and respective electrical reflective multistrip coupling means each arranged to receive acoustic wave energy from a corresponding end of the input transducing means and to relaunch at least part of that energy as acoustic wave energy back towards a corresponding end of the output transducing means in a cooperating transductive relationship, in which said input and output transducers are formed by respective interdigital electrode arrays each comprising parallel strip electrodes which are respectively connected to a corresponding one or the other of a pair of bus bars extending along the corresponding sides of the interdigital electrode array, and in which the respective reflective coupling means each comprise a first and a second array of mutually parallel conducting strips arranged respectively across an input and an output propagation track, each array including a first set of mutually insulated alternately widely and closely spaced strips, and a second set of electrically interconnected strips arranged so that at least one strip from the second set is situated between substantially every widely spaced pair of strips forming the first set, each strip forming a widely spaced pair in the first set of one array being respectively connected to a corresponding strip forming a closely spaced pair in the first set of the other array, and the second set of strips in both arrays being connected together, characterized in that corresponding ends of the input and output transducers are each respectively coupled via a corresponding coupling path comprising an odd plurality of cascaded said reflective couplers, and that for each reflective coupler, the centre-to-centre spacing of the strips is modified in a corresponding manner along the first and the second array such that the input acoustic wave energy contained in successive frequency bands, which are at least contiguous, is correspondingly reflectively transferred to the output track by groups of said strips associated with different amounts of average signal delay, the transfer of input acoustic wave energy being substantially complete at least at one frequency within the desired passband, and the respective distributions of signal delay with respect to frequency in the individual reflective couplers being so arranged in each coupling path that the overall propagation delay is substantially the same for all frequencies within the desired passband of the device.

Thus contiguous bands of frequencies can be reflected by corresponding individual groups of uniformly spaced electrodes forming either a monotonic or, if the number of groups equals the number of reflective couplers included in a coupling path, a permutated sequence along each coupler array, or the electrode spacing can be varied continuously and monotonically therealong.

The invention is based on the realisation that, although a wider overall passband could be provided by merely adding further reflective coupling sections working in adjacent contiguous frequency bands along the acoustic wave energy propagation tracks of the coupler, an adverse effect will occur in that respective signal components relating to these different frequency bands will suffer differing average amounts of signal delay as they are reflectively transferred by the corresponding coupling section causing an undesirable amount of frequency dispersion, but that this difficulty can be overcome by providing at least two reflective couplers in tandem along the acoustic wave energy coupling path from the input to the output transducer, and arranging the coupling sections in the various reflective couplers so that the frequency dispersion resulting from one or some of the reflective multistrip couplers in the coupling path, is effectively compensated by that resulting from the remaining coupler or couplers in the path.

Figure 2:
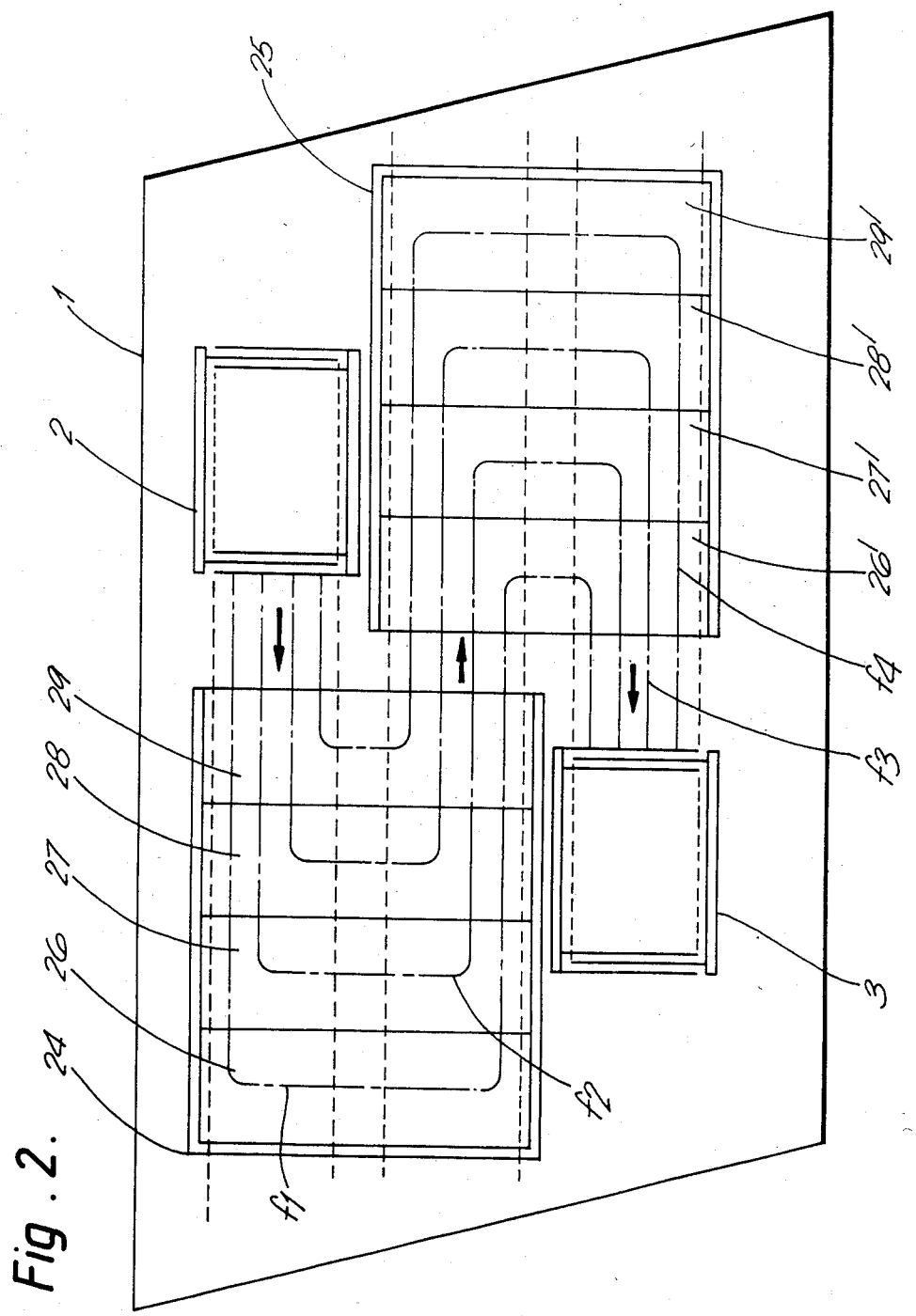
Figure 3A:
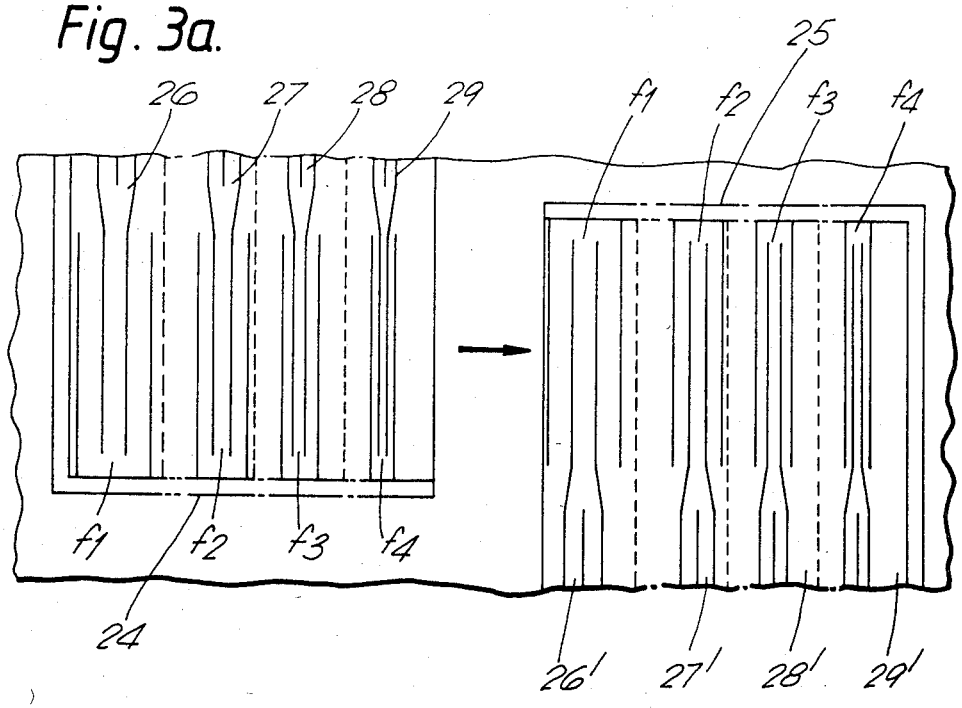
Figure 3B:
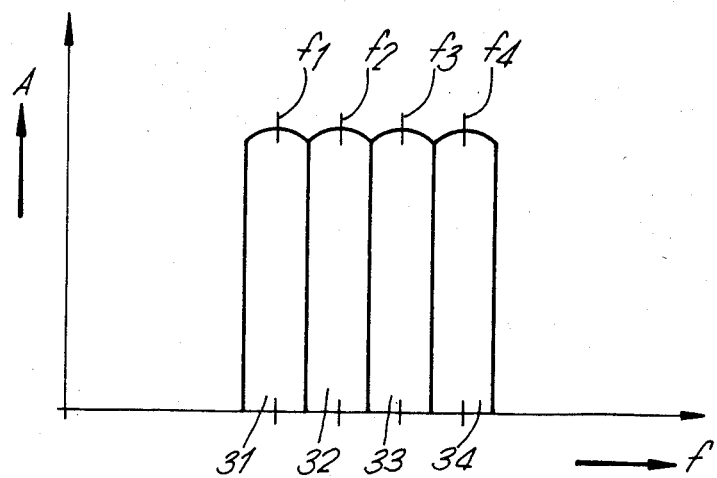
Figure 4A:
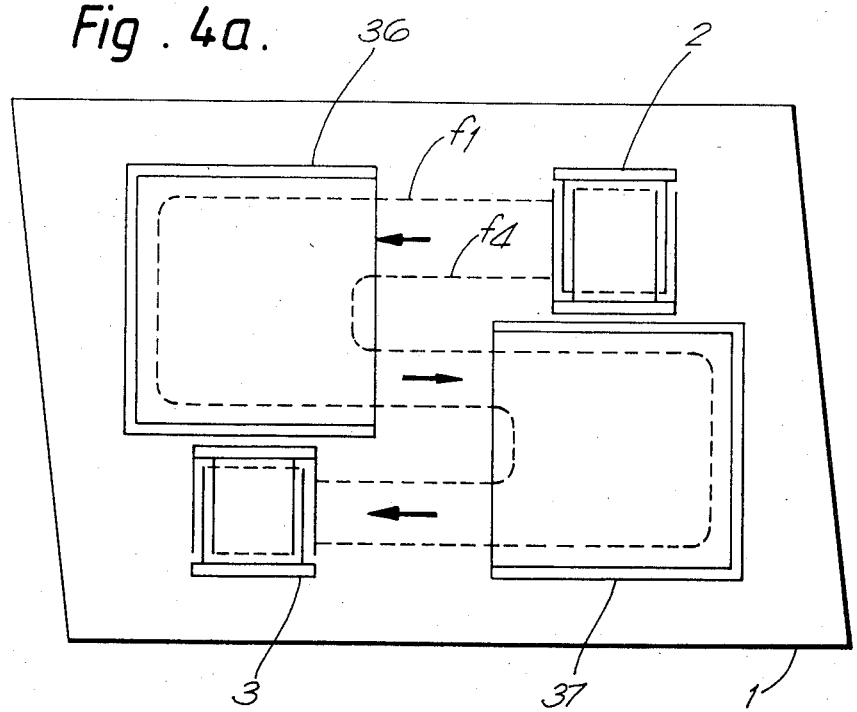
Figure 4B:
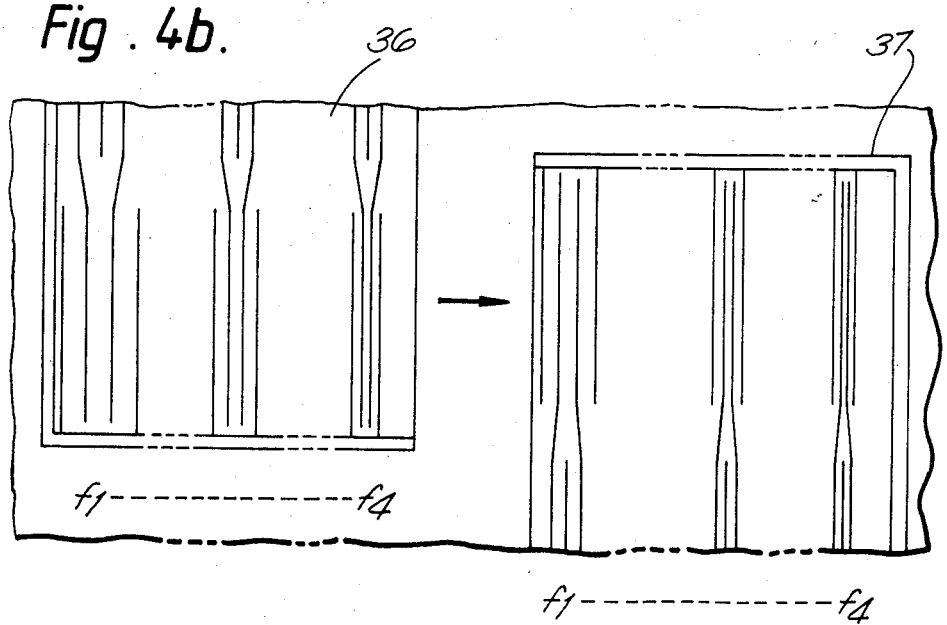
Figure 5:
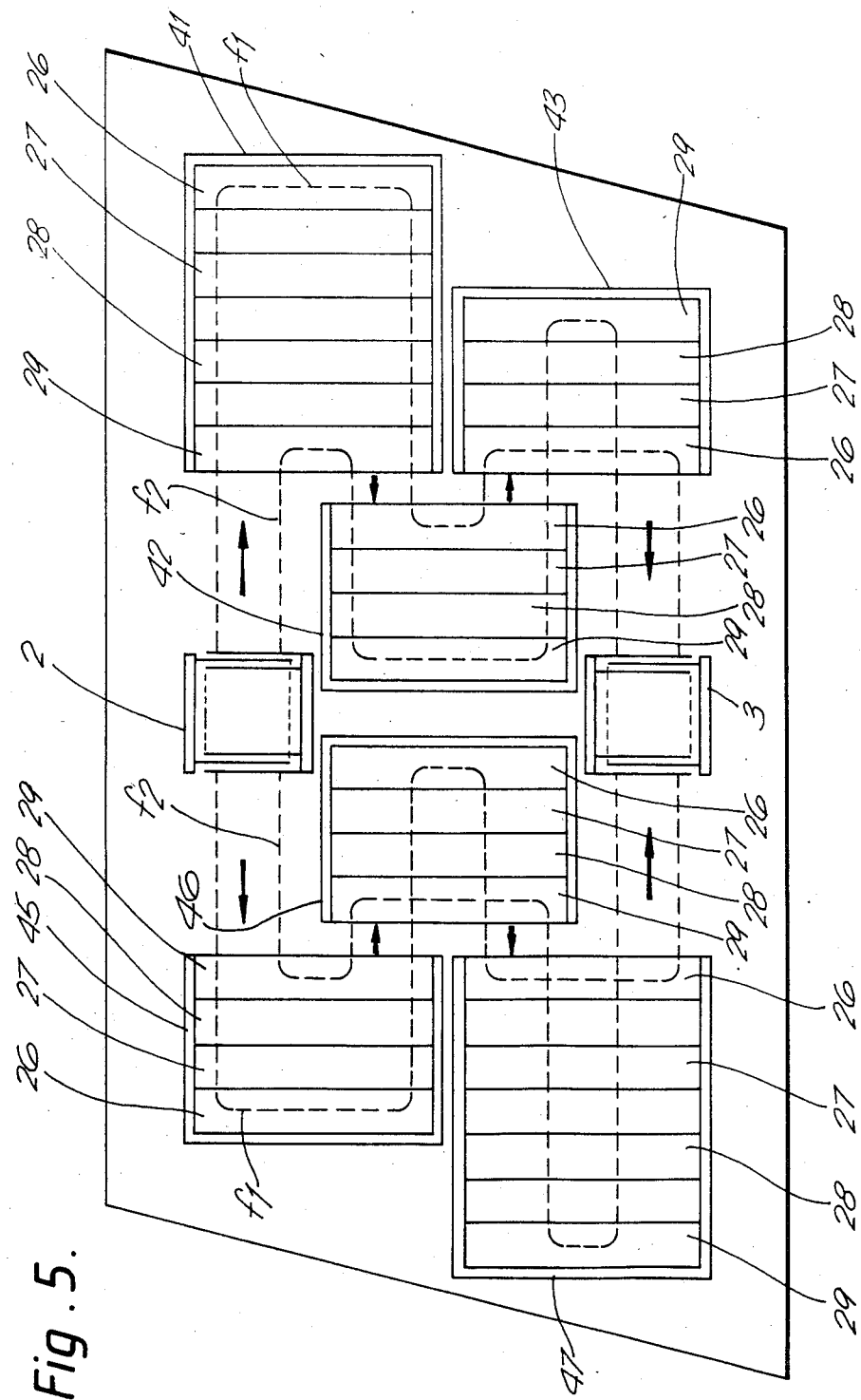

Embodiments of the invention will now be described, by way of example, with reference to the accompanying drawings, in which:

FIG. 1 illustrates a known surface wave band pass filter device,

FIG. 2 illustrates one form of surface wave filter in accordance with the invention, FIG. 3a illustrates a part of the device of FIG. 2, FIG. 3b is a graph depicting the frequency response of the device of FIG. 2, FIGS. 4a and 4b illustrates an alternative device in accordance with the invention, and FIG. 5 illustrates a low-loss surface acoustic wave bandpass filter device in accordance with the invention.

Referring to the drawings, FIG. 1 shows a surface acoustic wave bandpass electrical filter device as described in European Patent Application Publication No. 0098661. A piezoelectric substrate 1 is provided with a major surface suitable for the propagation of surface acoustic waves. Input transducing means in the form of an interdigital electrode array 2 bounded on each side by respective bus bars 17, 18, is arranged on said surface so as to launch acoustic wave energy along a first propagation track 11 at said surface. Output transducing means in the form of a further interdigital electrode array 3 bounded on each side by respective bus bars 19, 20, is arranged on said surface adjacent to one side of the input transducing array 2 so as to receive acoustic wave energy from a second propagation track 12 at said surface, which is parallel to, but does not overlap the first track 11. The interdigital arrays forming the input and output transducers 2, 3 are conventionally made up of double electrodes with a uniform centre-to-centre spacing of $\lambda_c/4$. Electrical reflective coupling means in the form of a reflective multistrip coupler 4 is arranged on said surface so as to receive acoustic wave energy from the input transducing array 2 via the first track 11 and to relaunch at least part of that energy as acoustic wave energy back towards the output transducing array 3 via the second track 12.

The reflective multistrip coupler 4 comprises a first array 5 of mutually parallel conducting strips 7, 7' arranged across an input propagation track 21, and a second array 6 of mutually parallel conducting strips 8, 8' arranged across an output propagation track 22. Each array 5, 6 consists of a respective first set of mutually insulated alternately widely and closely spaced strips 7, 8, and a second set of strips 7', 8', which are electrically interconnected by a peripheral bus-bar 9, 10. In the device shown in FIG. 1, one of the strips 7', 8', of the second set is situated between each widely spaced pair 13 of the strips 7, 8, forming the first set of each array 5, 6, and the centre-to-centre spacing of the strips 7, 7', or 8,8', along the corresponding track 21, 22, is $\lambda_c/3$, where $\lambda_c$ is the acoustic wavelength at the centre frequency $f_c$ of the passband of the coupler. Each strip 7 forming a widely spaced pair 13 in the first set of one array, is respectively connected to a corresponding strip 8 forming a closely spaced pair 14 in the first set of the other array by means of a corresponding interconnecting strip 16. The bus bars 9, 10, interconnecting the strips 7', 8', forming the second sets of the respective arrays 5, 6, are connected together by an interconnecting bus bar portion 15.

The device illustrated in FIG. 1 is a wide aperture device meaning that the width of the acoustic aperture of the respective input and output transducers 2 and 3, represented by the maximum electrode overlap and equivalent to the width of the corresponding tracks 11 and 12, is greater than about 10 $\lambda_c$, and would normally lie in the range 20 $\lambda_c$ to 100 $\lambda_c$, where $\lambda_c$ is the acoustic wavelength at the centre frequency $f_c$ of the passband of the device. For this reason, the strip electrodes of the 5 arrays making up the transducers 2, 3, and the reflective coupler 4, are shown as broken lines along part of their length indicating an overall length in the above range. It should also be understood that only a few of the strip electrodes in each respective array are actually represented in the drawings for the sake of clarity.

As explained in the preamble, the length of the reflective coupler arrays 5, 6 is determined by the requirement to transfer as much energy as possible in the reflective direction from the input to the output tracks 21, 22, within the passband of the device. The width of the passband of a reflective multistrip coupler as shown in FIG. 1 is therefore primarily determined by the coupling coefficient k of the piezoelectric substrate because it is this factor which determines the total number N of uniformly spaced strips 7, 7', or 8, 8', required in the coupler array 5, 6, to transfer nearly all the acoustic energy from the input track 21 to the output track 22 so as to propagate back towards the output transducer 3, at least at one frequency lying within the passband of the device. The bandwidth of the passband is proportional to 1/N. When using a typical Y-cut Z-propagating monocrystalline wafer of lithium niobate as the substrate 1, the length of each of the arrays 5, 6, would be about 100 $\lambda_c$, and the input and output transducers 2, 3, would each be of a similar length.

The device can be made into a so-called low-loss device by locating a second reflective multistrip coupler 4', shown in dashed outline, adjacent the other end of the input and output transducers 2, 3, so that acoustic energy is also correspondingly received from the input transducer 2 and relaunched so as to be received by the output transducer 3 in cooperating transductive relationship with the acoustic energy received from the coupler 4. In this way full use can be made of the surface acoustic wave energy launched by the input transducer 2 in both directions.

FIG. 2 illustrates one form of acoustic wave bandpass electrical filter device in accordance with the invention in which an input transducer 2 is coupled to an output transducer 3 via a coupling path which includes two reflective multistrip coupler assemblies 24 and 25, respectively, in cascade. Each of the coupler assemblies 24, 25, comprise a first (input) and a second (output) array of parallel conducting strips whose centre-to-centre spacing is modified monotonically and in a corresponding manner along said first and second arrays of a given coupler assembly.

In the device of FIG. 2 the strips are arranged in successive groups 26, 27, 28, 29, such that the strips in a given group all have the same spacing, while the spacing changes monotonically along the array from one group to the next. Each group is made up of a number of strips such that acoustic wave signals in a corresponding band of frequencies are transferred from the input propagation track to the output propagation track, and preferably that this transfer is substantially complete, i.e. that no acoustic energy remains in the input track at that frequency. The spacings of the strips in successive groups 26, 27, 28, 29, are such that acoustic wave energy contained in successive contiguous frequency bands is correspondingly transferred thereby.

This is illustrated by FIGS. 3a and 3b. FIG. 3a indicates the spacing in the output track of the reflective coupler assembly 24 of the strips in the respective groups 26, 27, 28 and 29, which is the same as the corresponding strip spacing in the input track of the assembly 24. FIG. 3b is a graph indicating the frequency responses of the respective groups of strips. Thus in FIG. 3a the left hand group 26 contains strips having the widest spacing and the group as a whole transfers signals in a band 31 having the lowest centre frequency $f_1$, as indicated in FIG. 3b. The next group 27 contains strips having a narrower spacing such that the group as a whole transfers signals in a frequency band 32 whose centre frequency is $f_2$, and which is substantially contiguous with the first frequency band 31. Similarly the respective groups 28 and 29 have successively narrower spacing so as to transfer signals in corresponding higher frequency bands 33 and 34 which are respectively similarly contiguous with the band 32 and with one another. In this way an overall passband is provided for the assembly 24 which has four times the width of a corresponding basic reflective coupler as shown in FIG. 1.

However, it will be observed that the signals transferred by the group 26 have to travel to the far end of the assembly and back, and are therefore significantly delayed relative to signals transferred by the group 29 which is situated at the entrance of the coupling assembly 24. This variation of delay with frequency, in other words dispersion, is undesirable for many forms of bandpass filter device. To reduce this undesirable effect, the output from the reflective coupling assembly 24 is fed to the input of the second reflective coupling assembly 25 so as to encounter corresponding groups of coupler strips 26', 27', 28', 29', whose respective uniform spacings are monotonically varied from the input port of the assembly 25 in the opposite manner to that employed in the assembly 24. In this way signals in the frequency band 31, which were delayed by the greatest amount in the assembly 24, are immediately reflectively transferred by the group 26' of strips, which have the same centre-to-centre spacing as the strips in the group 26, to the entrance of the output transducer, while the signals in the other frequency bands are progressively delayed and transferred by the successive corresponding groups 27', 28', 29', whose strip spacings correspond to those of groups 27, 28, 29 of the assembly 24, so that the overall propagation delay from the input transducer 2 to the output transducer 3 is substantially the same for all frequencies within the desired passband of the device.

The input and output transducers 2, 3, can be uniform transducers or they can be weighted for example by withdrawal weighting or by apodisation. Although four groups of strips are shown for the assemblies 24, 25, more or fewer groups can be provided depending on the relative bandwidth required and on the practicable size of the substrate 1, although at frequencies above about 300 MHz this latter consideration would be of much less significance.

The arrangement of the strips in the input and the output tracks of the coupling assemblies 24, 25, in groups related to individual frequency bands, enables a certain amount of weighting to be applied to the frequency response of the reflective multistrip coupler assembly if desired. For example, if an odd number of groups were employed, the number of strips making up the central group could be determined by the requirement for a maximum transfer of the acoustic signal from the input to the output track. The number of strips in the other groups could then be reduced to provide a suitable modification of the amplitude-frequency response, bearing in mind that reducing the number of strips in a group will increase the main passband for signals transferred by that group and this implies that the centre-to-centre spacing may also have to be modified so that the overall amplitude-frequency response in the passband is sufficiently smoothly defined and does not contain undesired peaks and troughs. The overall response could be further modified by allowing adjacent passbands to overlap. Preferably this should only be used when the acoustic energy transferred by each adjacent group within its corresponding passband is less than complete, and would introduce the disadvantage that the overall delay for signals whose frequencies are common to both overlapping passbands will be correspondingly spread out in time.

Thus in the embodiment of FIG. 2, it is preferable that adjacent passbands should be merely contiguous and should not overlap to a significant extent, especially when a substantially complete transfer of acoustic energy occurs for frequencies within each passband because in that case signals common to both adjacent passbands would be reflectively transferred on each occasion by the first of the adjacent groups to be encountered and as a consequence the overall delay for those signals would be markedly different from the corresponding common delay provided for the remainder of the signals in the overall passband.

An alternative form of acoustic wave bandpass filter device in accordance with the invention is illustrated diagrammatically in FIGS. 4a and 4b, the latter of which represents the disposition of some of the electrodes in extended reflective multistrip couplers 36, 37, which are employed in the device shown in FIG. 4a in place of the assemblies 24 and 25. In each of the couplers 36, 37, the centre-to-centre spacing of the strips forming the input and output arrays is correspondingly continuously and monotonically varied with respect to distance at least along the major portion of each array. The variation in the two arrays 36, 37, is reversed with respect to one another and with respect to the input-/output end of each coupler.

The rate of change of the spacing along the arrays is arranged so that a sufficiently complete reflective transfer of acoustic energy is provided from the input track to the output track, i.e. so that the output energy is directed in the opposite direction to that in the input track, at at least one frequency in the desired passband.

As in the device of FIG. 2, the delay of a signal with respect to frequency will progressively alter for each coupler 36 and 37 but without the discontinuities resulting from the individual groups of strips, and in a similar manner to that used in FIG. 2, variation of the strip spacing in opposite senses from the input/output end for the two couplers is used to ensure that the overall signal delay for the device of FIG. 4a is made substantially independent of frequency.

In the case of this arrangement also, the amplitude-frequency response within the overall passband of the device can be modified, in this case by varying the rate of change of the centre-to-centre spacing of the strips along the arrays and the overall length of the couplers.

Reference has been made to a continuous variation of the spacing along the arrays, however it may in some cases be desirable for the spacing at certain locations, for example at each end of the arrays, to be constant for a certain number of strips. In the example about half the overall number of strips required to transfer all the signal in that frequency band to the output track, are distributed in an equally spaced manner at the two ends of the array in order to provide a steeper attenuation edge to the overall passband.

FIG. 5 illustrates a so-called low-loss acoustic wave bandpass electrical filter device in accordance with the invention in which acoustic energy launched from each end of the input transducer 2 is coupled via a corresponding coupling path to a corresponding end of the output transducer 3 in a co-operating transductive relationship. In this arrangement it is necessary to provide an odd plurality of reflective multistrip coupler assemblies in each coupling path in order to couple the same ends of the respective transducers. Thus in FIG. 5, the right hand end of the input transducer 2 is coupled via respective reflective multistrip coupler assemblies 41, 42, 43, in cascade to the right hand end of the output transducer 3. The left hand end of the input transducer 2 is similarly coupled via respective reflective multistrip coupler assemblies 45, 46, 47, in cascade to the left hand end of the output transducer 3.

As in the device shown in FIG. 2, each of the reflective multistrip coupler assemblies 41, 42, 43, 45, 46 and 47 is formed by a succession of groups 26, 27, 28, 29, of strips having corresponding different centre-to-centre spacings so as to transfer signals lying in associated frequency bands 31, 32, 33, 34.

As before, signals in the different frequency bands will be delayed by different amounts in a reflective assembly. However since there have to be an odd number of reflective assemblies in the coupling path, one or some assemblies must have a different delay against frequency characteristic from others if the overall delay is to be made the same for all of the frequency bands. In the present example in which three assemblies are used, that assembly which provides an opposite delay with frequency response to the other two will have to provide twice the amount of delay between signals of corresponding frequency bands than the other two assemblies.

Thus the assemblies 45 and 46 are formed identically to the assembly 24 shown in FIG. 2, but the assembly 47, although having the reverse sequence of groups 26, 27, 28, 29, from the input/output end, is arranged so that each group is separated from the next adjacent group by an inactive section equal in length to that of the group, and which contains isolated or dummy strips in order to preserve the same acoustic velocity along the track.

In the other coupling path the reflective assembly 41 is similarly made to provide twice the opposite amount of frequency band dispersion to that caused by each of the assemblies 42 and 43. It should be noted that it is immaterial which extreme frequency band is reflected by the first group in an array provided that the overall delay through each coupling path is made the same for all frequency bands.

The difference in the lengths of the reflective array assemblies can be reduced if more assemblies are used in each coupling path, for example if five are used. However, the size of the device may then be found to be unfavourable at lower frequencies, i.e. below about 100 MHz.

In the low-loss device of FIG. 5 the input and output transducers can be weighted, but to keep insertion loss down as far as possible, the method of withdrawal weighting is preferred. It is also necessary to ensure that the number of strips in each of the groups is correct for the substantially complete transfer of signal in the corresponding frequency band to the output track in each case when it is required to provide a wide passband and a uniform (flat) amplitude-frequency response.

The device of FIG. 5 can be modified to a more compact form if the number of reflective assemblies in each coupling path is equal to the number of groups of strips in each assembly because then a constant overall signal delay can be achieved by permutating the locations of the groups along the arrays. In this case the spacing will no longer change monotonically along the array but the distinct frequency bands represented by the corresponding groups must represent a contiguous assembly.

The embodiments herein described have been illustrated in FIGS. 2, 4a and 5 as wide aperture devices, similar in this respect to the known device of FIG. 1. It is to be understood, however, that the invention can readily be applied to surface acoustic wave devices which employ the single symmetrical waveguide mode of surface acoustic wave propagation which is possible in suitably dimensioned interdigital transducers and other periodic electrode structures such as reflective multistrip couplers, as described in, for example, European Patent Application Publication Nos. 0106384 and 0103932, and the devices described herein can be readily adapted to operate using this propagation mode.

I claim:

1. A surface-propagating acoustic wave bandpass electrical filter device comprising: a piezoelectric substrate able to propagate acoustic waves at a surface thereof, an input transducer arranged to launch acoustic wave energy along a first propagation track at said surface, an output transducer arranged to receive acoustic wave energy from a second propagation track at said surface which does not overlap said first track, and electrical reflective multistrip coupling means arranged to receive acoustic wave energy correspondingly from the input transducer and to relaunch at least part of that energy as acoustic wave energy back towards the output transducer, said input and output transducers comprising respective interdigital electrode arrays and the reflective multistrip coupling means including a reflective coupler comprising a first and a second array of mutually parallel conducting strips arranged respectively across corresponding input and output propagation tracks, each array including a first set of mutually insulated alternately widely and closely spaced strips, and a second set of electrically interconnected strips arranged so that at least one strip from the second set is situated between substantially every widely spaced pair of strips forming the first set, each strip forming a widely spaced pair in the first set of one array being respectively connected to a corresponding strip forming a closely spaced pair in the first set of the other array, and the second set of strips from both arrays being connected together, characterized in that a corresponding end of the input and output transducers are coupled via a coupling path comprising a plurality of cascaded said reflective couplers, and that for each reflective coupler, the centre-to-centre spacing of the strips is modified in a corresponding manner along the first and the second array such that the input acoustic wave energy contained in successive frequency bands, which are at least contiguous, is correspondingly reflectively transferred to the output track by groups of said strips associated with different amounts of average signal delay, the respective distributions of a signal delay with respect to frequency in the individual reflective couplers being so arranged in the coupling path that the overall propagation delay is substantially the same for all frequencies within the desired passband of the device.

2. A device as claimed in claim 1, characterized in that for each reflective coupler the center-to-center spacing of the strips is modified monotonically in a corresponding manner along said first and second arrays.

3. A device as claimed in claim 1, characterized in that, within each group of strips forming part of an array of a reflective multistrip coupler, which group is associated with a corresponding one of the said frequency bands, the center-to-center spacing of the strips is uniform.

4. A device as claimed in claim 3, characterized in that the number of said groups of strips forming each array of the reflective multistrip couplers is equal to the number of reflective multistrip couplers in the or each said coupling path, and a constant overall signal delay is achieved for all frequencies within the desired passband by permutating the locations of the groups along the arrays of the successive reflective multistrip couplers in the or each coupling path.

5. A low-loss surface acoustic wave bandpass electrical filter device comprising: a piezoelectric substrate able to propagate acoustic waves at a surface thereof, an input transducer arranged to launch acoustic wave energy along a propagation track at said surface, an output transducer arranged to receive acoustic wave energy from a further propagation track at said surface which is substantially parallel to but does not overlap said first track, and respective electrical reflective multstrip coupling means each arranged to receive acoustic wave energy from a corresponding end of the input transducer and to relaunch at least part of that energy as acoustic wave energy back towards a corresponding end of the output transducer in a co-operating transductive relationship, in which said input and output transducers are formed by respective interdigital electrode arrays each comprising parallel strip electrodes which are respectively connected to a corresponding one or the other of a pair of bus bars extending along the corresponding sides of the interdigital electrode array, and in which the respective reflective coupling means each comprise a first and a second array of mutually parallel conducting strips arranged respectively across an input and an output propagation track, each array including a first set of mutually insulated alternately widely and closely spaced strips, and a second set of electrically interconnected strips arranged so that at least one strip from the second set is situated between substantially every widely spaced pair of strips forming the first set, each strip forming a widely spaced pair in the first set of one array being respectively connected to a corresponding strip forming a closely spaced pair in the first set of the other array, and the second set of strips in both arrays being connected together, characterized in that corresponding ends of the input and output transducers are each respectively coupled via a corresponding coupling path comprising an odd plurality of cascaded said reflective couplers, and that for each reflective coupler, the centre-to-centre spacing of the strips is modified in a corresponding manner along the first and the second array such that the input acoustic wave energy contained in successive frequency bands, which are at least contiguous, is correspondingly reflectively transferred to the output track by groups of said strips associated with different amounts of average signal delay, the transfer of input acoustic wave energy being substantially complete at least at one frequency within the desired passband, and the respective distributions of signal delay with respect to frequency in the individual reflective couplers being so arranged in each coupling path that the overall propagation delay is substantially the same for all frequencies within the desired passband of the device.

6. A device as claimed in claim 5, characterised in that for each reflective coupler the centre-to-centre spacing of the strips is modified monotonically in a corresponding manner along said first and second arrays.

7. A device as claimed in claim 5, characterised in that, within each group of strips forming part of an array of a reflective multistrip coupler, which group is associated with a corresponding one of the said frequency bands, the centre-to-centre spacing of the strips is uniform.

8. A device as claimed in claim 7, characterised in that the number of said groups of strips forming each array of the reflective multistrip couplers is equal to the number of reflective multistrip couplers in the or each said coupling path, and a constant overall signal delay is achieved for all frequencies within the desired passband by permutating the locations of the groups along the arrays of the successive reflective multistrip couplers in the or each coupling path.

9. A device as claimed in claim 6, characterised in that the centre-to-centre spacing of strips forming an array of a reflective multistrip coupler is continuously modified with respect to distance at least along the major portion of the array.

* * * * *